United States Patent [19]
Hsieh et al.

[11] Patent Number: 5,976,927
[45] Date of Patent: Nov. 2, 1999

[54] TWO MASK METHOD FOR REDUCING FIELD OXIDE ENCROACHMENT IN MEMORY ARRAYS

[75] Inventors: Chia-Ta Hsieh, Tainan; Di-Son Kuo, Hsinchu; Yai-Fen Lin, Taichung; Hung-cheng Sung, Hsinchu, all of Taiwan

[73] Assignee: Taiwan Semiconductor Manufacturing Company, Ltd., Hsin-Chu, Taiwan

[21] Appl. No.: 09/058,120

[22] Filed: Apr. 10, 1998

[51] Int. Cl.[6] .................. H01L 21/8247; H01L 21/8242; H01L 21/76

[52] U.S. Cl. .......................... 438/239; 438/257; 438/297; 438/439

[58] Field of Search ...................... 438/239–266, 438/439, 294, 297

[56] References Cited

U.S. PATENT DOCUMENTS

| | | | |
|---|---|---|---|
| 4,373,248 | 2/1983 | McElroy | 29/571 |
| 5,103,274 | 4/1992 | Tang et al. | 357/23.5 |
| 5,120,671 | 6/1992 | Tang et al. | 437/43 |
| 5,466,624 | 11/1995 | Ong et al. | 437/52 |
| 5,534,455 | 7/1996 | Liu | 437/43 |
| 5,714,412 | 2/1998 | Liang et al. | 438/266 |

*Primary Examiner*—Richard Booth
*Attorney, Agent, or Firm*—George O. Saile; Stephen B. Ackerman

[57] ABSTRACT

A method for forming a field oxide isolation regions of a memory array is described. The field isolation regions comprise a rectangular array of oxide islands. The oxide islands are formed by a two mask process wherein the first mask is a LOCOS hardmask which defines an array of parallel field oxide stripes. The field oxide stripes are thermally grown by a LOCOS oxidation process. A second mask, which has an array of parallel stripes perpendicular to the field oxide stripes is then patterned over the wafer. The stripes of the second mask expose a plurality of narrow sections of the field oxide stripes which are then etched by a directional plasma etch having a high selectivity of silicon oxide over silicon. The anisotropic etch segments each of the longer oxide stripes into a string of islands space apart by a narrow gap through which a robust common source line passes unencumbered by birdsbeak oxide. The edges of the field oxide at the gap have vertical walls and square corners which afford improved spacing of components in the vicinity of the gap. The method eliminates the need for a mask bias to accommodate corner rounding and birdsbeak oxide encroachment which occurs if the islands are defined by a single mask process.

12 Claims, 5 Drawing Sheets

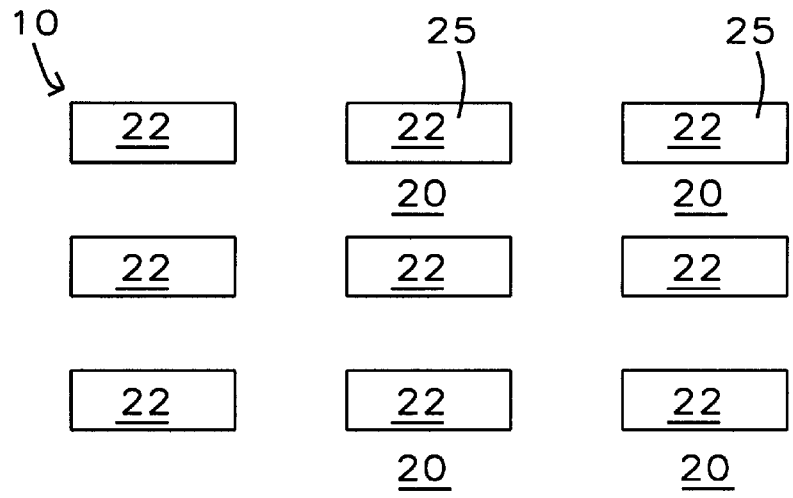
FIG. 1 – Prior Art
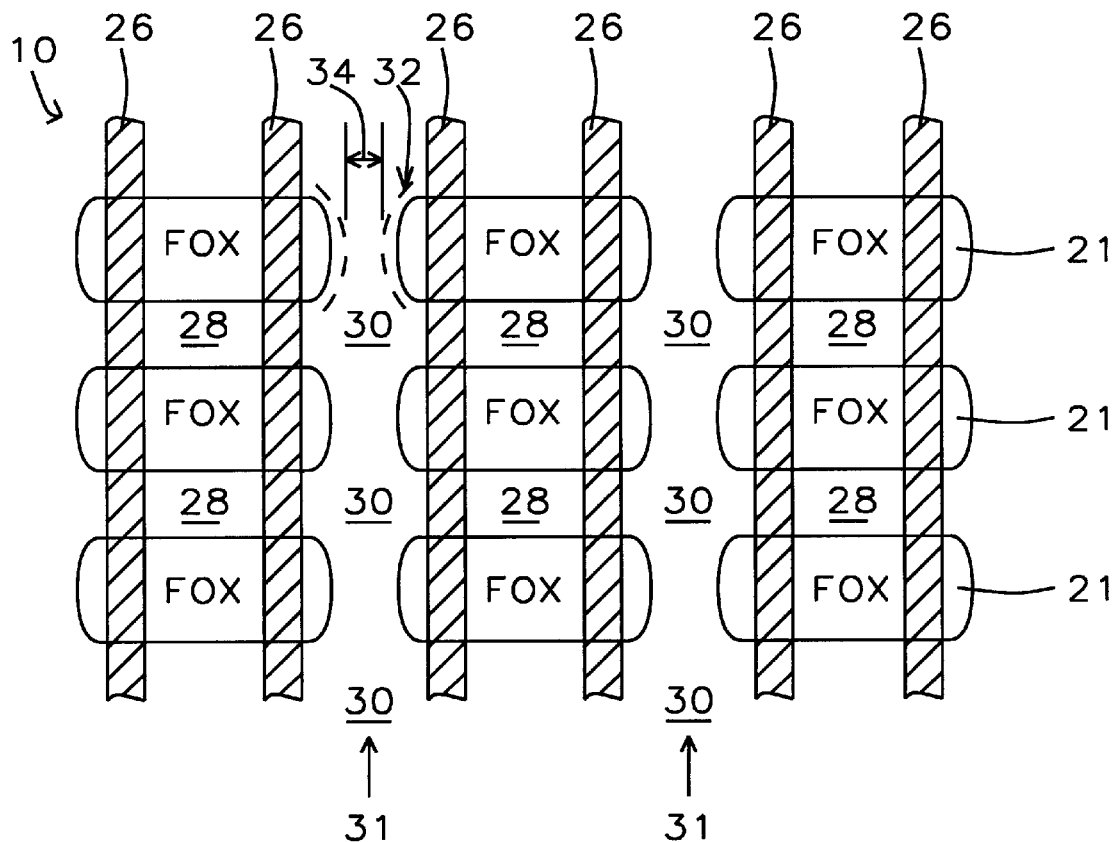
FIG. 2 – Prior Art

TWO MASK METHOD FOR REDUCING FIELD OXIDE ENCROACHMENT IN MEMORY ARRAYS

BACKGROUND OF THE INVENTION (1) Field of the Invention

The invention relates to processes for the manufacture of semiconductor devices and more particularly to the formation of field isolation in memory arrays.

(2) Introduction and Description of Prior Art

Computer memory consist of vast arrays of storage cells which can be addressed by wordlines and bitlines. The most commonly used DRAM (dynamic random access memory) cell design comprises a transfer gate(usually an MOS field-effect-transistor(MOSFET) and a storage node consisting of a capacitor plate connected to the MOSFET drain. Memory cells for ROMs (read only memories), PROMS (programmable ROMs) and EEPROMs (electrically erasable PROMS) are similarly arranged in rectangular arrays and are addressed by wordlines and bitlines but typically have their storage nodes formed by a floating gate which lies subjacent to an addressable control gate. Memory cells require a high cell density in order to achieve high performance and cost efficiency.

The simplicity of cell design permits the interconnection of elements of the transfer MOSFET, thereby permitting simpler and more effective array design. Notably, the control gates of all the MOSFETs of a wordline may be formed of a single polysilicon band, traversing alternately over field oxide and cell gate regions. Likewise, the sources of the MOSFETs in a DRAM bitline string may be formed of a single diffusion or individual source diffusions, isolated by field oxide, may be interconnected by a superjacent addressable bitline. The interconnection of source elements by a diffusion band is found in EEPROM memory arrays. The drains of each of the MOSFETs must however remain unique and therefore electrically isolated.

The necessary field isolation for memory circuits is typically provided by a relatively thick layer of silicon oxide formed by the well known LOCOS (Local oxidation of silicon) process. For a conventional flash EPROM memory array, the field isolation regions are formed by a pattern of rectangular islands In FIG. 1 there is shown a planar view of a region on a wafer upon which a LOCOS oxidation mask 20 for a memory cell array 10 has been patterned by a prior art process. The openings 25 expose rectangular areas of silicon 22 which are to be oxidized to form islands of field oxide (FOX). FIG. 2 shows the same region after the LOCOS oxidation has been performed and the oxidation mask has been stripped. The FOX islands provide the required isolation between the elements of the MOSFET devices which are to be formed in the active areas 28 and 30. The MOSFETs are formed by growing a gate oxide(not shown) over the active areas 28,30, patterning polysilicon gate electrode stripes 26 over the array 10 and finally forming source regions 30 and drain regions 28 by ion implantation. The source/drain elements are self-aligned to the gate electrode stripes 26. The source active areas 30 for each MOSFET are connected along the columns by a continuous source diffusion along the columns 31. The drains 28 are isolated in each cell by the FOX regions.

Forming the FOX isolation stripes in this manner leads to problems of birds beak encroachment into the active regions between the ends of the short stripes. Referring to FIG. 2, the birds beak encroachment, shown by the dotted line 32 is caused by the penetration of oxide under the LOCOS mask which reduces the effective width 34 of the source diffusion in this region. In order to compensate for this reduction, the spacing between the FOX line ends must be increased. This problem is discussed in some detail by Tang, et.al U.S. Pat. No. 5,103,274, and Tang, et.al. U.S. Pat. No. 5,120,671 in the formation of an EPROM, Flash EPROM, or EEPROM. The problem is overcome by these references by growing the FOX isolation as one long stripe and, after both floating polysilicon gates and the polysilicon control gate lines have been patterned, a mask is applied which protects the FOX isolating the drain regions and exposes the FOX between two adjacent polysilicon control gate lines. The exposed FOX is then etched out by reactive ion etching(RIE) forming short FOX stripes with vertical walled ends. The source regions which are subsequently formed, are self aligned to the polysilicon gate lines as also are the ends of the FOX islands. In order to self-align on the gate lines, an edge portion of the gate line is exposed to the FOX RIE.

Liu, U.S. Pat. No. 5,534,455 points out problems encountered by the method of Tang, '274, and Tang, '671 which include damage and undercutting of the gate or tunnel region beneath the gate stack as well as the formation of a silicon step resulting from over-etching of the FOX. The problem is overcome by Liu, by forming a sidewall along the poly gate line stack which protects the gate or tunnel region and displaces the over-etch step.

Ong, et.al., U.S. Pat. No. 5,466,624 cites a method for introducing an additional stripe of FOX isolation to establish a pair of adjacent drain diffusions. The memory arrays formed are of the floating gate type as found in EEPROMs. During processing, long FOX isolation stripes are formed which are subsequently segmented by a selective oxide etch. The segments provide isolation alongside the channel regions of the MOSFETs. Unlike Tang, '274, and Tang, '671, the floating gate polysilicon and the FOX sections are successively etched using the same mask. Thus the gate polysilicon is not partially exposed during the FOX etching but is covered by the mask and a nitride layer. Like Tang, '274, and Tang, '671, however, the ends of the FOX islands are aligned with an edge of the floating gate polysilicon.

Not all EEPROM designs permit this alignment commonality however. The floating gate pattern often does not coincide with the edge of the source diffusion outside of the channel region, in particular where the common source channel passes between FOX regions. This can be seen in the structure of a flash EEPROM cites by Liang, et.al., U.S. Pat. No. 5,714,412 where the floating gate edges are not aligned with the ends of the FOX islands. Clearly, it is not always possible to cut a FOX stripe into segments by the same etchant operation which patterns the floating gate in the manner of Ong, et.al.

Etching the FOX segments after the floating gate has been patterned in the manner of Tang, '274, and Tang, '671, requires the exposure of a portion of the floating gate to the FOX etchant. This would not be possible in cases where the polysilicon gate stack has an oxide cap layer over it as in the manufacture of a split gate flash EEPROM by the ETOX™ (EEPROM with Tunnel OXide) process cited by Liang, et.al., '412.

McElroy, U.S. Pat. No. 4,373,248 also addresses the formation of a floating gate memory array having diffusion interconnected strings of sources and drains which are connected to column decoders. Long stripes of FOX isolation are employed but they are not subsequently segmented into smaller units.

SUMMARY OF THE INVENTION

It is an object of this invention to provide a method for eliminating encroachment of field oxide isolation regions into active source channels of memory arrays, thereby permitting tighter spacing of memory cell elements adjacent to a common source line.

It is yet another object of this invention to assure the formation of a robust source line un obstructed by field oxide encroachment.

It is another object of this invention to provide a method of forming field oxide islands in memory cell arrays with vertical sidewalls along at least a portion of their perimeters.

It is yet another object of this invention to provide a method of forming field oxide islands in memory cell arrays having vertical sidewalls along at least a portion of their perimeters and wherein said vertical sidewalls are formed independent of the position of polysilicon gate electrodes.

It is yet another object of this invention to provide a method of forming field oxide islands in memory cell arrays having vertical sidewalls along at least a portion of their perimeters and wherein said vertical sidewalls are formed prior to the formation of gate or tunnel oxides.

It is yet another object of this invention to provide a method for reducing the minimum design ground rule spacing between the ends of field oxide islands in memory cell arrays.

It is still another object of this invention to provide a method for forming rectangular field oxide islands which have square corners.

These objects are accomplished by forming field oxide isolation islands by a two mask process wherein the first mask is a LOCOS hardmask which defines an array of parallel field oxide stripes. The first mask is formed of silicon nitride on a pad oxide. The field oxide stripes are next thermally grown by a LOCOS oxidation process. A second mask, which has an array of parallel stripes perpendicular to the field oxide stripes is then patterned over the wafer. The stripes of the second mask expose a plurality of narrow sections of the field oxide stripes which are then etched by directional plasma etch having a high selectivity of silicon oxide over silicon. After etching, the second mask is stripped and each of the original field oxide stripes is broken down into a string of oxide segments spaced apart by a distance corresponding to the width of the stripes on the second mask.

BRIEF DESCRIPTION OF THE DRAWINGS

FIG. 1 is a planar view of a LOCOS mask patterned to form an array of field oxide segments according to a prior art process.

FIG. 2 is a planar view of a array of field oxide segments formed by LOCOS using a prior art process showing also the positioning of wordlines, drains and source channels.

DESCRIPTION OF THE PREFERRED EMBODIMENTS

Figure 3:
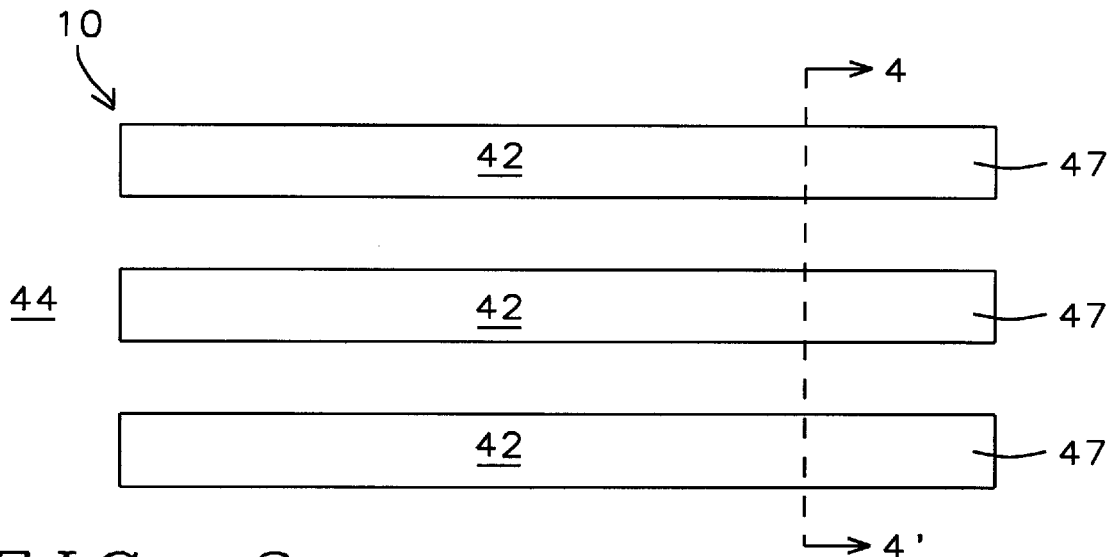
FIG. 3 is a planar view of a LOCOS mask patterned to form an array of field oxide stripes according to the process disclosed by this invention.

Accordingly, in a first embodiment of this invention, the formation of a DRAM memory cell array is described. A LOCOS hardmask is used to define a pattern of field oxide stripes which span the width of a memory cell array. Referring to FIG. 3 there is shown a plan view of a section of a patterned silicon nitride hardmask 44 having openings 47 which expose a subjacent pad oxide layer 42. The hardmask is used to define the field oxide stripes which are formed by thermal oxidation using the well known LOCOS process. The processing steps used in the formation of the field oxide stripes are hereafter described with reference to FIGS. 4a through 4d which are cross sections of the substrate wafer along the line 4–4' of FIG. 3.

Figure 4A:
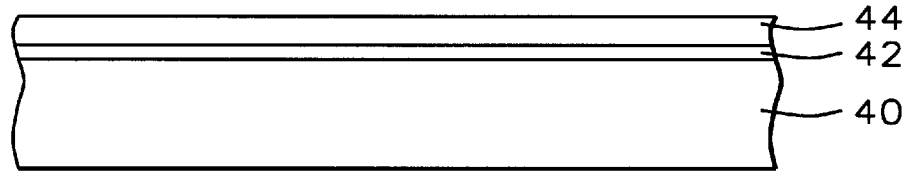
FIGS. 4a through 4d are cross sectional views show a sequence of process steps used in the implementation of the current invention.
Figure 4B:
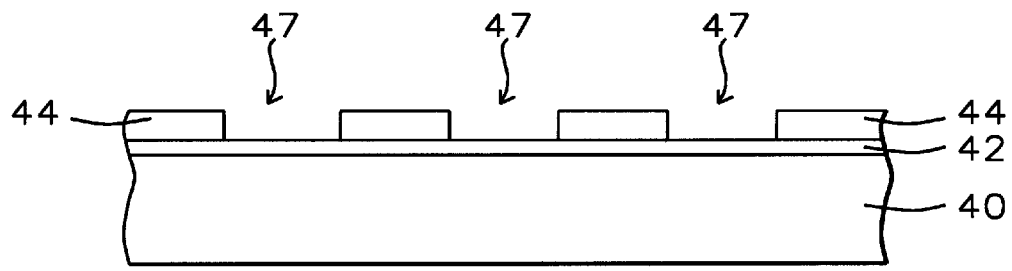

Referring now to FIG. 4a, a P-doped <100> oriented monocrystalline silicon wafer 40 is provided. An oxidation hardmask is formed by first growing a layer of silicon oxide(pad oxide) 42 to a thickness of between about 150 and 250 Angstroms by subjecting the wafer 40 to a clean dry oxidizing ambient in a furnace between about 850 and 1000° C. A layer 44 of silicon nitride is then deposited, preferably by low-pressure-chemical-vapor-deposition (LPCVD). The silicon nitride layer 44 is then patterned, for example by the use of photolithography, to form the openings 47 which expose the subjacent pad oxide layer 42. The openings 47 are made using conventional anisotropic etching techniques such as reactive-ion-etching. Appropriate etchants and conditions to provide high etch-rate-ratios are well known to those practicing this art such that the taper of the walls of the resultant opening can be well controlled, and the etching can be terminated within the pad oxide 42. The resultant hardmask with openings 47 is shown in FIG. 4b.

Figure 4C:
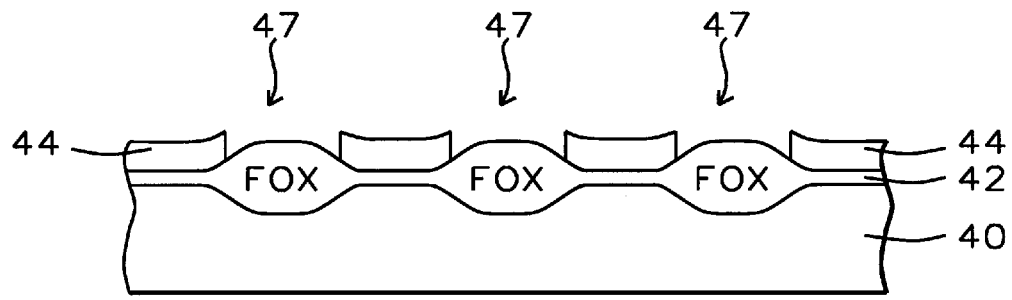

The field oxide 48 is next grown in a clean oxidation furnace using an ambient gas containing oxygen, either alone or in combination with water, and preferably with a chlorine containing additive such as trichloroethane to minimized mobile ion contamination. The oxidation temperature is typically between 950° to 1100° C. FIG. 4c shows a cross section of the field oxide stripes 47 after the oxidation step. The thickness of the field oxide(FOX) 48 grown in the openings 47 is between about 0.4 and 0.6 microns. Note in the figure that the edges of the oxidation hardmask mask 44 have been pushed up by the lateral growth of oxide through the pad oxide 42. This lateral growth is commonly referred to as birds beak and many process variations have been exploited to minimize and control it.

Figure 4D:
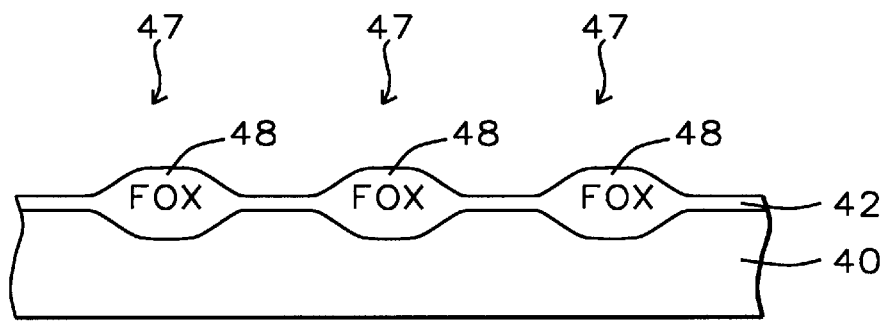

The residual silicon nitride layer 44 is next removed by conventional isotropic aqueous etchants. The profile of the completed field oxide isolation is shown in FIG. 4D.

Figure 5:
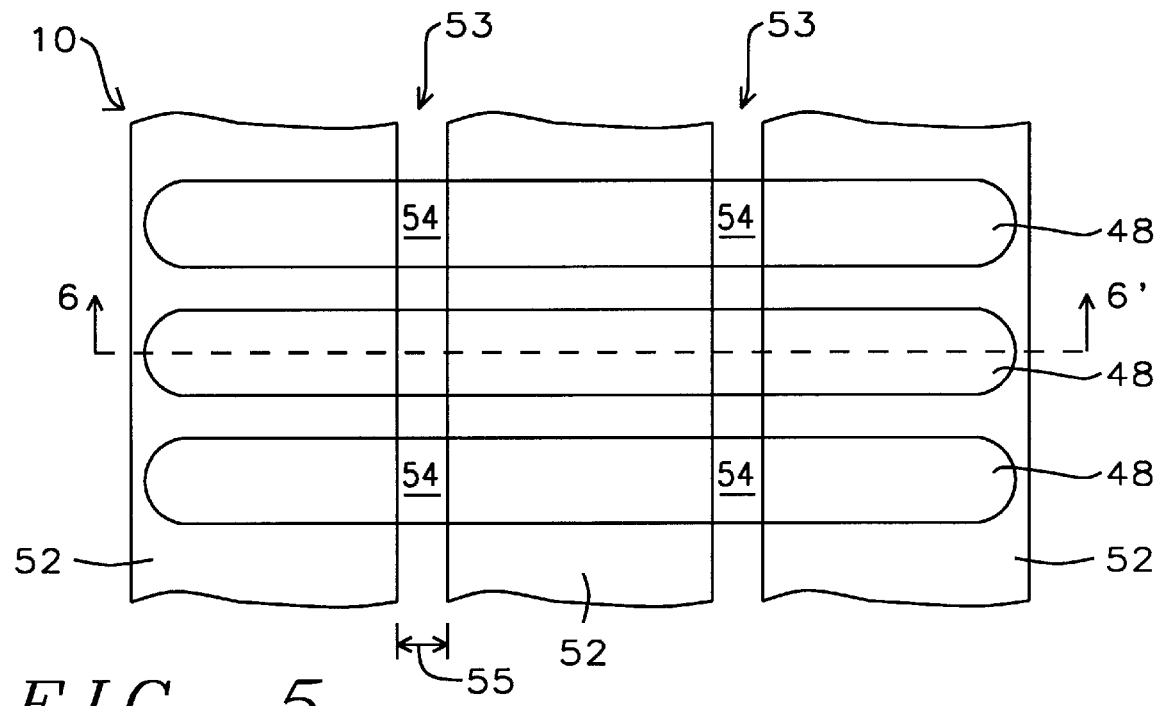
FIG. 5 is a planar view of an array of field oxide segments formed by LOCOS using the process of this invention and showing also the positioning of a second mask which is used to etch spaces in the field oxide stripes to form an array of smaller field oxide isolation segments.

Referring now to FIG. 5 a second patterning mask 52 is applied over the wafer. This mask, preferably of photoresist, exposes narrow portions 54 of the field oxide stripes 48 within the columns 53. These portions 54 are then etched out using an anisotropic etch, thereby subdividing the field oxide stripes into a plurality of smaller line segments. The processing steps employed in the formation of these segments are hereafter described with the aid of cross sectional views along the line 6–6' of FIG. 5 shown in FIG. 6a and 6b.

Figure 6A:
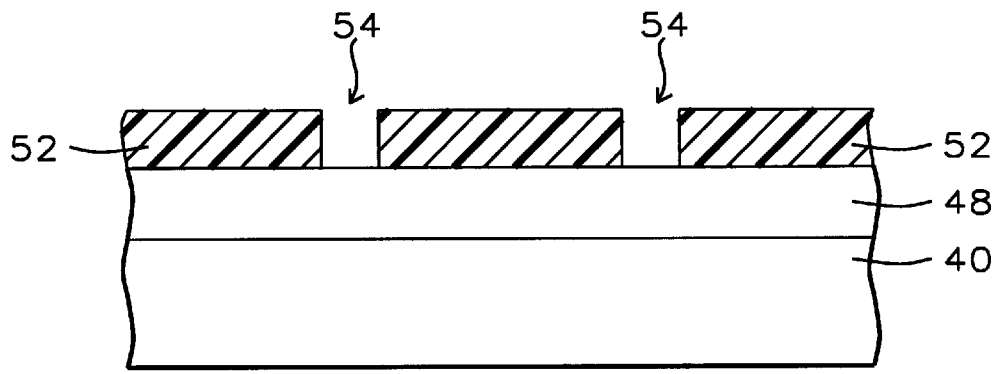
FIGS. 6a and 6b are cross sectional views show a sequence of process steps used in the implementation of the current invention.

Referring now to FIG. 6a, a patterning layer 52, preferably of photoresist is formed over the wafer 40. The openings 54 correspond to the exposed field oxide portions 54 in the channels 53 in FIG. 5. The wafer 40 is then placed in a reactive-ion-etching station and the field oxide layer 48 is etched back to the silicon surface in the exposed regions 54. The etching conditions and gaseous ambients are chosen such that the etching proceeds unidirectionally, normal to the plane of the wafer. Further the etch-rate-ratio of silicon oxide to silicon is chosen to be as high as possible, preferable greater than 10:1, to avoid etching of the underlying silicon. Such procedures are well known to the art of reactive-ion-etching and can be achieved with typical RIE stations.

Figure 6B:
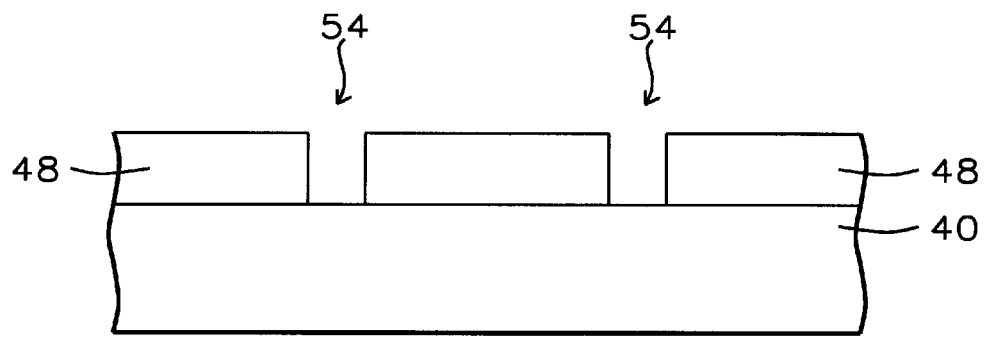

The reactant gas generally contains fluorocarbons. Precise end-point-detect monitoring during the run is essential to avoid over-etching. This is done by observing the partial pressure of carbon monoxide in the chamber with optical emission spectroscopy. Carbon monoxide is a product of the reaction of silicon oxide with the fluorocarbons. A decrease of carbon monoxide in the ambient signals a decrease in surface area of the silicon oxide which indicates that the silicon surface has been reached. After etching, the residual photomask 52 is stripped. The final profile of the field oxide isolation along the section 6–6' of FIG. 5 is shown in FIG. 6b.

Figure 7:
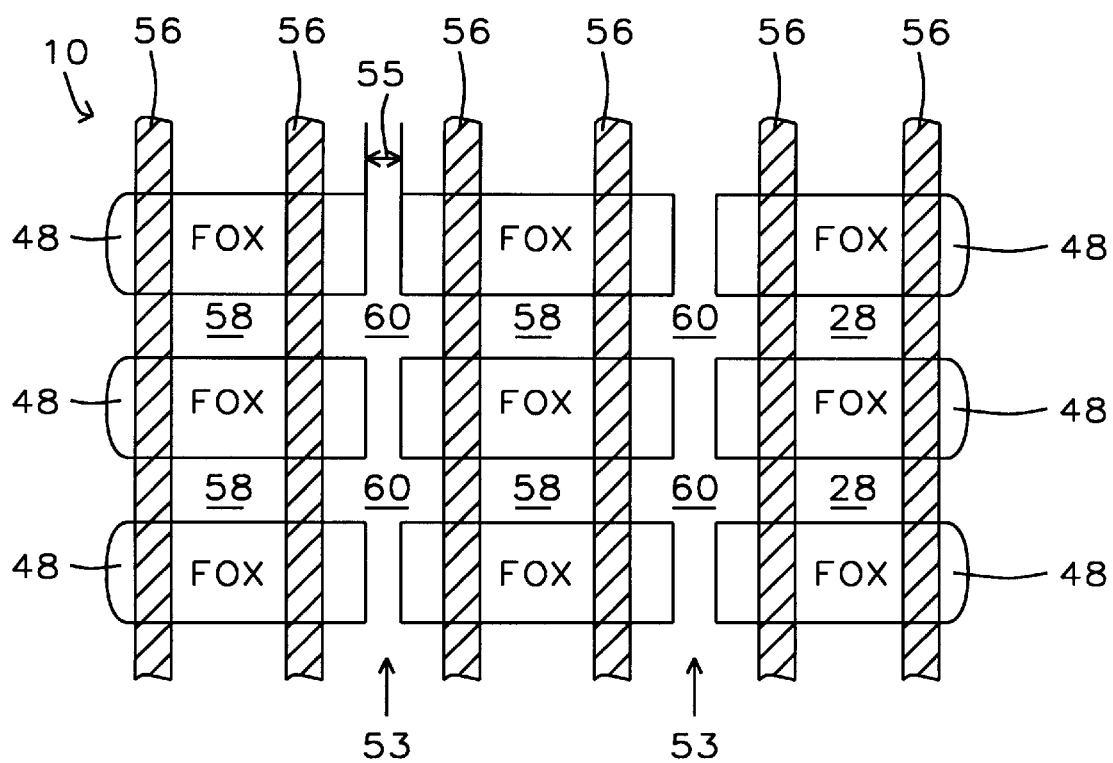
FIG. 7 is a planar view of a array of field oxide isolation segments formed by LOCOS using the process of this invention and showing also the positioning of wordlines, drains and a common source channel of a partially formed memory cell array.

Referring next to FIG. 7 a gate oxide is formed on the active regions 58,60 and polysilicon gate electrode structures 56 are formed by procedures well known by those in the art. The source 60 and drain 58 regions are then ion implanted, for example with arsenic, in the conventional manner. The source/drain regions are self-aligned to the gate electrodes 56 where the gate electrodes 56 pass over the active regions 58,60. An additional phosphorous source implant may be performed to form a deeper source diffusion 60, thereby further improving conductivity of the source stripe in the channel 53.

The mask dimension which defines the gap 55 does not need to be biased to accommodate field oxide encroachment as in the prior art. The spacing 55 is between about 0.2 and 0.5 microns. Also, corner rounding of the field isolation is eliminated permitting polysilicon gate electrodes to be placed closer to the edge of the isolation island. The source channel which passes between the isolation islands is robust in the gap 55 and is not obstructed by oxide extensions.

The drain regions 58 are isolated by FOX islands and are therefore electrically unique to each cell of the array 10. A storage capacitor(not shown) is next formed over each drain region by methods well known to those in the art of the manufacture of memory arrays. Any one of a great number of known capacitor configurations and formation processes may be used to form the storage capacitors. The storage plate of the capacitor is ohmically connected to the drain element 58 and the cell plate typically spans over a plurality of cells and is electrically grounded. The polysilicon gate electrode stripes form the wordlines of the array and are connected to wordline decoders. The source regions 53 form the bitlines of the memory cell array.

Figure 8:
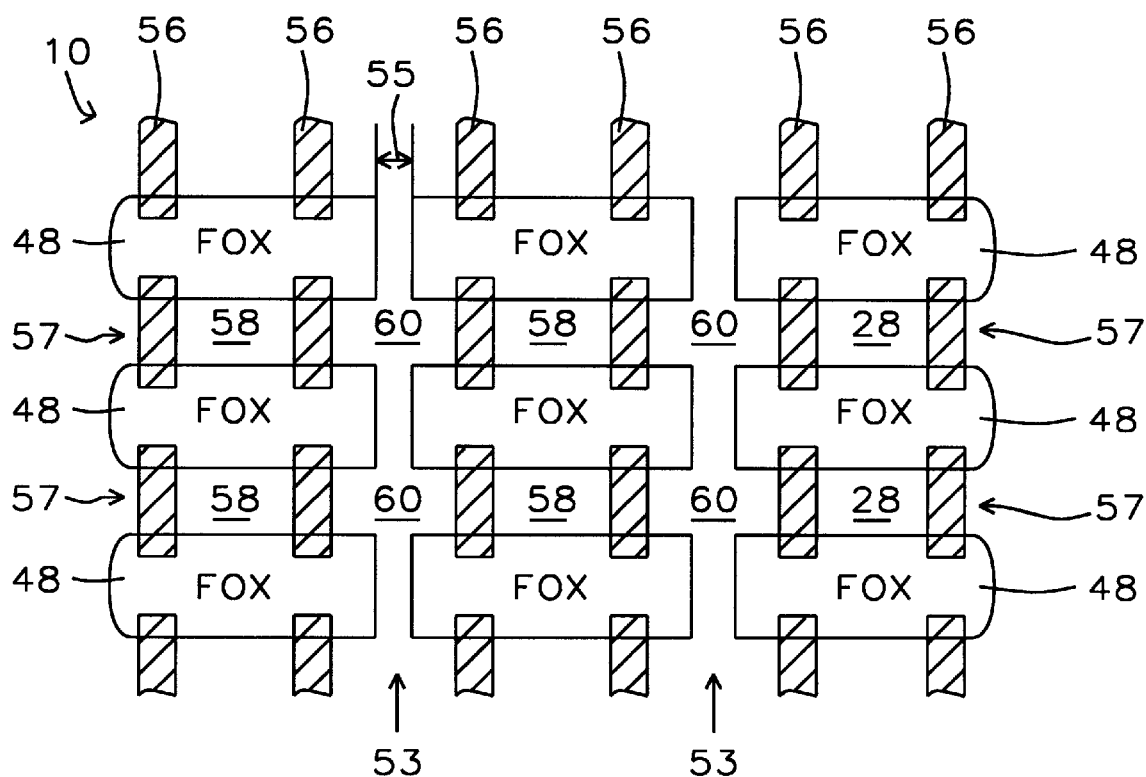
FIG. 8 is a planar view of an array of field oxide isolation segments formed by LOCOS using the process of this invention and showing also the positioning of floating gates of a partially formed flash EEPROM with a common source channel.

In a second embodiment of this invention a memory array is formed wherein the storage node of each memory cell comprises a floating gate element. Such memory arrays are typically found in flash EEPROMs. In the second embodiment, the processing steps are identical to those of the first embodiment up to and including the source/drain formation. Instead of forming storage capacitors to the drain elements 58 (FIG. 8), the storage nodes are formed of the polysilicon stripes 56. The stripes 56 are segmented by well known photolithographic procedures to form discrete floating gates 57 for each MOSFET. Next a thin insulative layer, preferably an ONO(oxide-nitride-oxide) composite layer, is formed over the floating gates and a second polysilicon control gate which constitutes a wordline stripe is formed over the segmented string of polysilicon floating gates. The procedures for forming floating gate structures with superjacent continuous polysilicon wordlines are well known to those skilled in the art and are not described in detail here.

The individual drain elements 58 are subsequently interconnected by contacts to continuous metal line(not shown) and are typically grounded. The source diffusions 60 along the channels 53 are directed to column decoders located in the array periphery.

The embodiments described uses a p-type silicon wafer. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated.

While the invention has been particularly shown and described with reference to the preferred embodiments thereof, it will be understood by those skilled in the art that various changes in form and details may be made without departing from the spirit and scope of the invention.

What is claimed is:

1. A method for forming field oxide isolation for an integrated circuit memory array comprising:
   (a) providing a silicon wafer;
   (b) forming a pad oxide on said silicon wafer;
   (c) forming a silicon nitride layer over said pad oxide;
   (d) patterning said silicon nitride layer to form openings which define a plurality of continuous substantially parallel first stripes;
   (e) oxidizing said silicon wafer, thereby forming a plurality of field oxide stripes;
   (f) stripping said silicon nitride layer;
   (g) forming a masking layer over said silicon wafer;
   (h) patterning said masking layer to form openings which define a plurality of continuous substantially parallel second stripes, said second stripes being substantially perpendicular to said field oxide stripes, thereby exposing portions of said field oxide stripes; and
   (i) etching said exposed portions thereby segmenting said field oxide stripes into islands of field oxide isolation spaced apart along the length of said field oxide stripes by a gap.

2. The method of claim 1 wherein said field oxide stripes are between about 0.4 and 0.6 microns thick.

3. The method of claim 1 wherein said gap is between about 0.2 and 0.5 microns.

4. The method of claim 1 wherein said masking layer is photoresist.

5. A method for forming a memory cell array comprising:
   (a) providing a silicon wafer;
   (b) forming a pad oxide on said silicon wafer;

(c) forming a silicon nitride layer over said pad oxide;
(d) patterning said silicon nitride layer to form openings which define a plurality of continuous substantially parallel first stripes;
(e) oxidizing said silicon wafer, thereby forming a plurality of continuous substantially parallel field oxide stripes;
(f) stripping said silicon nitride layer;
(g) forming a masking layer over said silicon wafer;
(h) patterning said masking layer to form openings which define a plurality of continuous substantially parallel second stripes, said second stripes being substantially perpendicular to said field oxide stripes, thereby exposing portions of said field oxide stripes;
(i) etching said exposed portions thereby segmenting said field oxide stripes into rectangular islands of field oxide isolation spaced apart along the length of said field oxide stripes by a gap;
(j) forming a gate oxide over silicon regions between said islands of field oxide isolation;
(k) forming continuous substantially parallel polysilicon stripes over said gate oxide and said islands of field oxide isolation, said polysilicon stripes running perpendicular to said field oxide stripes, now segmented, alternately traversing over gate oxide and rectangular islands and whereby at least two polysilicon stripes traverse over each of said rectangular islands;
(l) forming source and drain regions thereby forming an array of MOSFETS whereby said drain regions are formed between said at least two polysilicon stripes traversing over each of said rectangular islands and said source regions are formed between polysilicon stripes passing over adjacent islands; and
(m) forming memory storage nodes to elements of said MOSFETs.

6. The method of claim 5 wherein said field oxide stripes are between about 0.4 and 0.6 microns thick.

7. The method of claim 5 wherein said gap is between about 0.2 and 0.5 microns.

8. The method of claim 5 wherein said masking layer is photoresist.

9. The method of claim 5 wherein said memory storage nodes comprise capacitors connected to said drain regions.

10. The method of claim 5 wherein said memory storage nodes comprise floating polysilicon gates.

11. The method of claim 5 further comprising:
(a) segmenting said polysilicon stripes thereby forming floating polysilicon gates;
(b) forming an insulative layer over said floating polysilicon gates; and
(c) forming polysilicon wordlines over said insulative layer.

12. The method of claim 11 wherein said memory storage nodes comprise said floating polysilicon gates.

* * * * *